United States Patent [19]

Petersen

[11] Patent Number: 4,916,590
[45] Date of Patent: Apr. 10, 1990

[54] SERIES RESONANT MAGNETIC AMPLIFIER POWER SUPPLY

[75] Inventor: Alan W. Petersen, Cupertino, Calif.

[73] Assignee: Spectra-Physics, San Jose, Calif.

[21] Appl. No.: 376,119

[22] Filed: Jul. 6, 1989

[51] Int. Cl.$^4$ .................... H02M 3/335; H02P 13/24
[52] U.S. Cl. ...................................... 363/28; 363/91; 363/136
[58] Field of Search ................... 363/27, 28, 75, 82, 363/90, 91, 96, 135, 136

[56] References Cited

U.S. PATENT DOCUMENTS

| | | | |
|---|---|---|---|
| 3,406,330 | 10/1968 | Pelly | 363/136 |
| 3,971,975 | 7/1976 | Genvit | 363/91 |
| 4,031,452 | 6/1977 | Longa et al. | 363/91 |
| 4,217,632 | 8/1980 | Bardos et al. | 363/91 |
| 4,442,479 | 4/1984 | Mäkimaa | 363/136 |
| 4,495,555 | 1/1985 | Eikelboom | 363/28 |
| 4,811,187 | 3/1989 | Nakajima et al. | 363/91 |

OTHER PUBLICATIONS

Chambers, "A New High Frequency Resonant Technique For Dynamic Correction Of Off-Line Converter Input Current Waveforms", Proceedings of POWER-CON 10, San Diego, CA, Mar. 22-24, 1987, F-1, pp. 1-7.
Reference Data for Radio Engineers, Fifth Edition, published by International Telephone and Telegraph Corporation (1968, pp. 14-1 through 14-5).

*Primary Examiner*—Peter S. Wong
*Attorney, Agent, or Firm*—Fliesler, Dubb, Meyer & Lovejoy

[57] ABSTRACT

A series resonant power supply is switched at a constant frequency above the audio range, in which a magnetic amplifier is used to control the magnitude of the output voltage. It can be run silently, while providing high power at relatively low cost. The power supply includes a full or half bridge rectifying circuit with first and second common terminals. A magnetic amplifier is coupled from the first common terminal to a second common terminal. The magnetic amplifier includes a first primary coil for conducting current from the first common terminal to the second terminal. A secondary coil for generating an output current, and a control coil receiving a control current are coupled with the first primary coil. A second primary coil is connected to conduct current from the second common terminal to the first common terminal. A second secondary coil and a second control coil are coupled with the second primary coil. The current is induced in the first and second secondary coils in response to current in the control coils, and current through the respective primary coils. An output circuit is coupled across the first and second secondary coils for converting the output of the magnetic amplifier to the regulated DC output.

12 Claims, 5 Drawing Sheets

BASIC HALF-BRIDGE SERIES RESONANT SUPPLY

HALF-BRIDGE RESONANT MAG-AMP SUPPLY

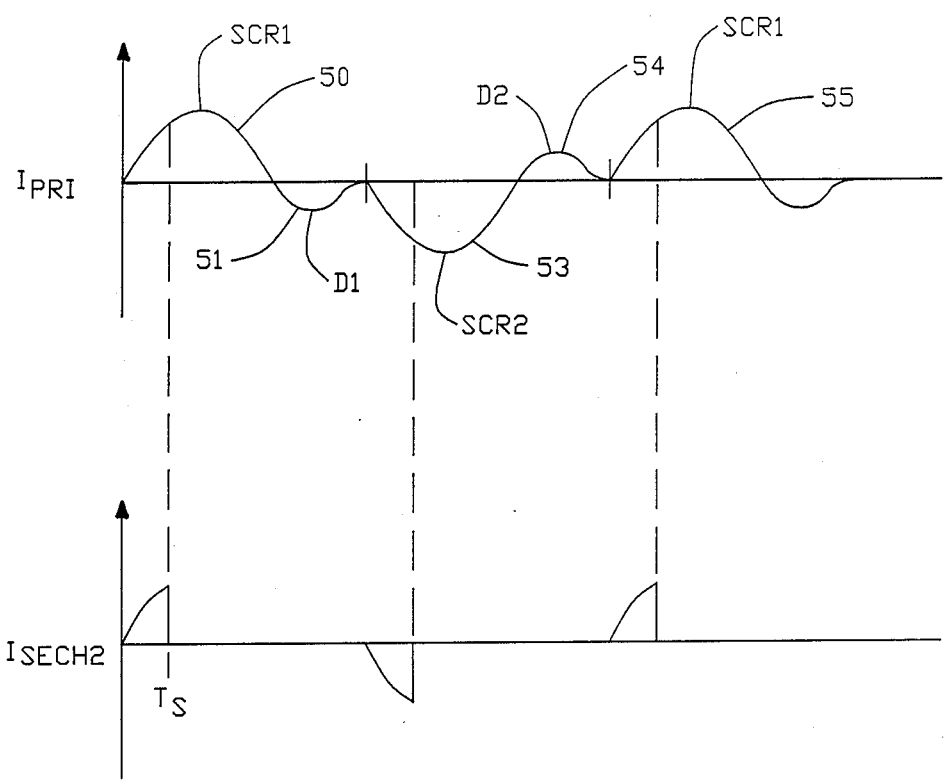

SERIES RESONANT MAGNETIC AMPLIFIER POWER SUPPLY

BACKGROUND OF THE INVENTION

1. Field of the Invention

The present invention relates to regulated DC power supplies, especially power supplies used for ion lasers and the like.

2. Description of Related Art

The series resonant power supply of the prior art is used for converting an unregulated input, such as may be generated by rectifying a line voltage from an electrical power utility company, to a regulated DC output.

An early reference disclosing the prior art series resonant power supply is Chambers, "A NEW HIGH FREQUENCY RESONANT TECHNIQUE FOR DYNAMIC CORRECTION OF OFF-LINE CONVERTER INPUT CURRENT WAVEFORMS", Proceedings of POWERCON 10, San Diego, Calif. Mar. 22-24, 1987, F-1, pp 1-7.

The basic half-bridge series resonant supply is shown in FIG. 1. The supply receives an unregulated input voltage $V_{IN}$ across a positive terminal 10 and a negative terminal 11. A first switching element, which in FIG. 1 comprises the silicon controlled rectifier SCR1, is coupled from terminal 10 to a common terminal 12, for switching current flow from terminal 10 to the terminal 12. A feedback diode D1 is coupled from terminal 12 to terminal 10. Likewise, a second switching element, consisting of the silicon controlled rectifier SCR2, is coupled from the terminal 12 to the negative input terminal 11. Feedback diode D2 is coupled from terminal 11 to the common terminal 12. A series resonant circuit from terminal 12 to terminal 13 consists of an inductor $L_R$, a capacitor $C_R$, and a primary coil of transformer T1. Terminal 13 is coupled through capacitor 14 to terminal 10 and through capacitor 15 to terminal 11. The secondary coil of the transformer T1 is coupled to a full-bridge rectifying circuit 16. The output of the full-bridge rectifying circuit is coupled across capacitor 17 and supplies the regulated output voltage.

In operation, SCR1 is turned on while SCR2 is off, establishing current flow from right to left through the transformer T1. Then, SCR2 is turned on and SCR1 turned off, establishing current flow from left to right. The resulting alternating current flow in the secondary coil of transformer T1 is rectified and results in a DC output $V_{OUT}$.

In order to increase or decrease the output voltage $V_{OUT}$, the frequency of switching SCR1 and SCR2 is increased or decreased, respectively. At higher switching frequencies, a higher average current is coupled into the secondary coil of the transformer T1 and higher output voltage results. For lower switching frequencies, less current is coupled into the secondary coil of the transformer T1 and lower output voltage results.

The problem with the prior art series resonant power supplies is that for lower output voltage, the switching frequency of the switching elements falls into the acoustic range, resulting in hum in the power supply. Hum in the power supply can be annoying, particularly in sensitive environments like medical operating rooms using laser surgical techniques.

Accordingly, it is desirable to have a high power regulated power supply with switching frequencies outside the audio range.

SUMMARY OF THE INVENTION

The present invention provides a series resonant power supply which is switched at a constant frequency above the audio range, and in which the transformer is replaced by a magnetic amplifier. The magnetic amplifier provides the control for regulating the output voltage, rather than changes in the switching frequency. Thus, it can be run silently, while providing regulated, high power at relatively low cost.

Accordingly, the present invention is a series resonant power supply for generating a regulated DC output in response to an unregulated DC input across a positive input terminal and a negative input terminal. A first switching element is connected between the positive input terminal and a common terminal. A second switching element is connected between the negative input terminal and the common terminal. A magnetic amplifier is coupled from the first common terminal to a second common terminal. The magnetic amplifier includes a first primary coil on a first saturable core for conducting current from the first common terminal to the second common terminal. A first secondary coil for generating a first output current, and a first control coil receiving a control current are also coupled with the first saturable core. A second primary coil on a second saturable core is connected to conduct current from the second common terminal to the first common terminal. A second secondary coil and a second control coil are coupled with the second saturable core. Current is induced in the first and second secondary coils in response to current in the control coils and current through the respective primary coils. An output circuit is coupled across the first and second secondary coils for converting the output of the magnetic amplifier to the regulated DC output.

The first and second switching elements are switched at a fixed frequency. Current is generated in the secondary coil when current flows in the primary, until the core saturates. The amount of the output current in a secondary coil is controlled by controlling the magnitude of the control current, which determines when in a cycle the core saturates. If the core saturates early in a cycle, less current is supplied to the output stage and a lower voltage results. If the core saturates later in the cycle, more current is supplied to the output stage and a higher voltage results.

The series resonant power supply according to the present invention can be implemented in a full-bridge or a half-bridge arrangement. Likewise, multiple regulated outputs can be generated from a single switching circuit.

Other aspects and advantages of the present invention can be seen upon review of the drawings, the detailed description and the claims which follow.

BRIEF DESCRIPTION OF THE FIGURES

FIG. 2A is a chart illustrating current flow in the primary coils of the magnetic amplifier.

FIG. 2B is a chart illustrating current flow in the secondary coils of the magnetic amplifier.

DETAILED DESCRIPTION

With reference to the figures, a detailed description of preferred embodiments of the present invention is provided.

Figure 1:
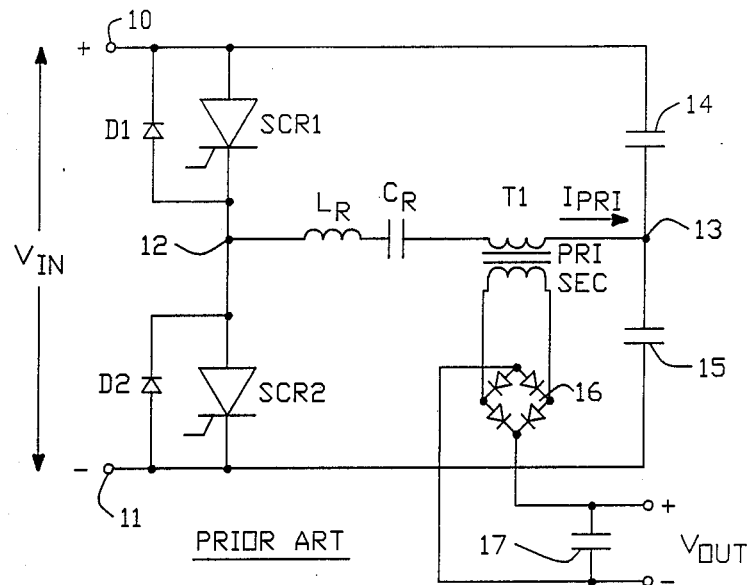
FIG. 1 is a schematic diagram of the basic half-bridge series resonant power supply, according to the prior art.
Figure 2:
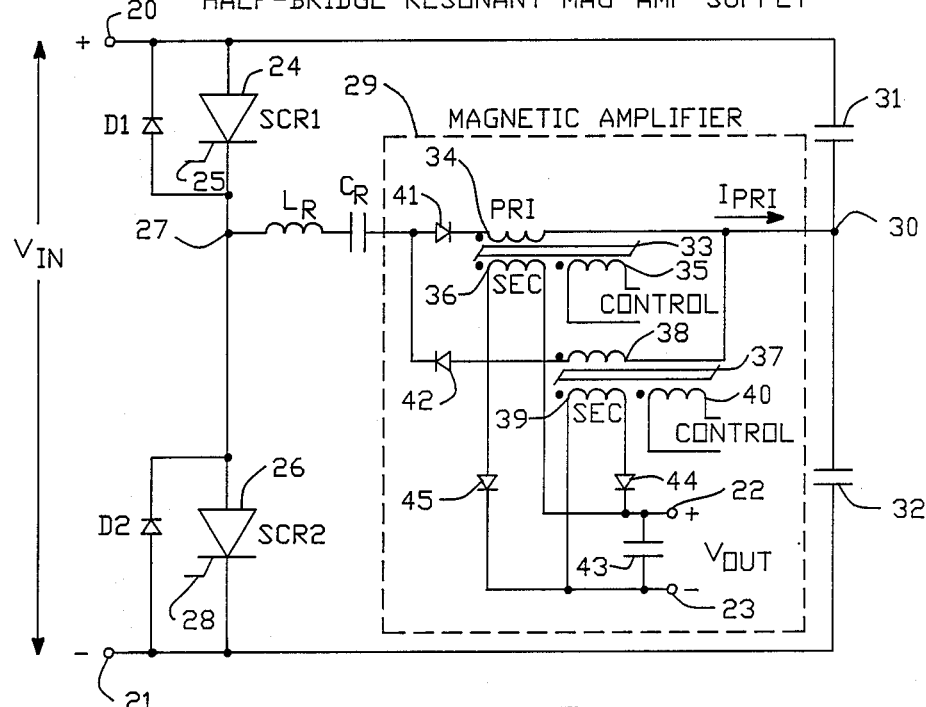
FIG. 2 is a schematic diagram of a half-bridge resonant magnetic amplifier power supply, according to the present invention.
Figure 3:
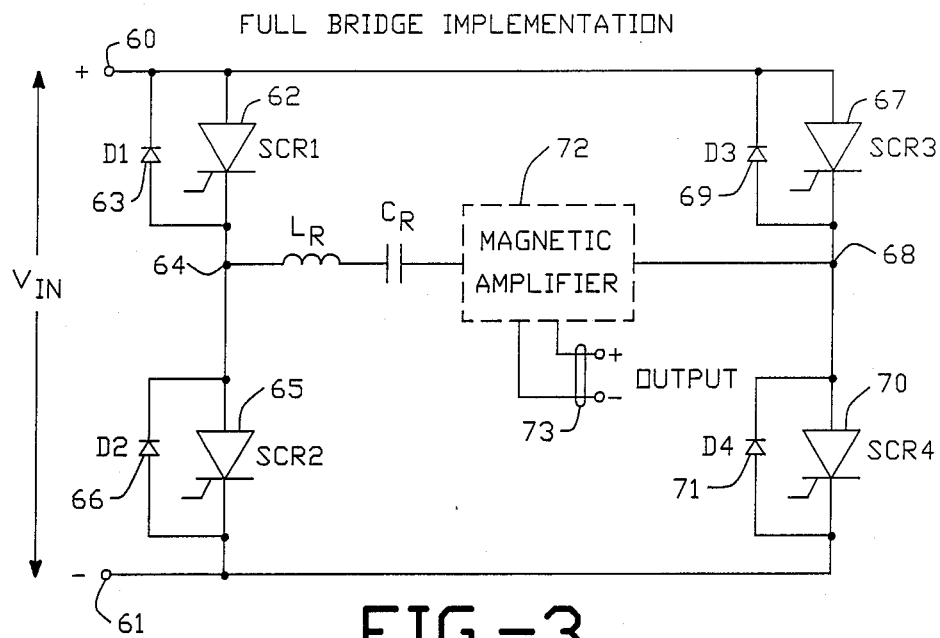
FIG. 3 is a schematic diagram of a full-bridge implementation of the series resonant magnetic amplifier power supply, according to the present invention.
Figure 4:
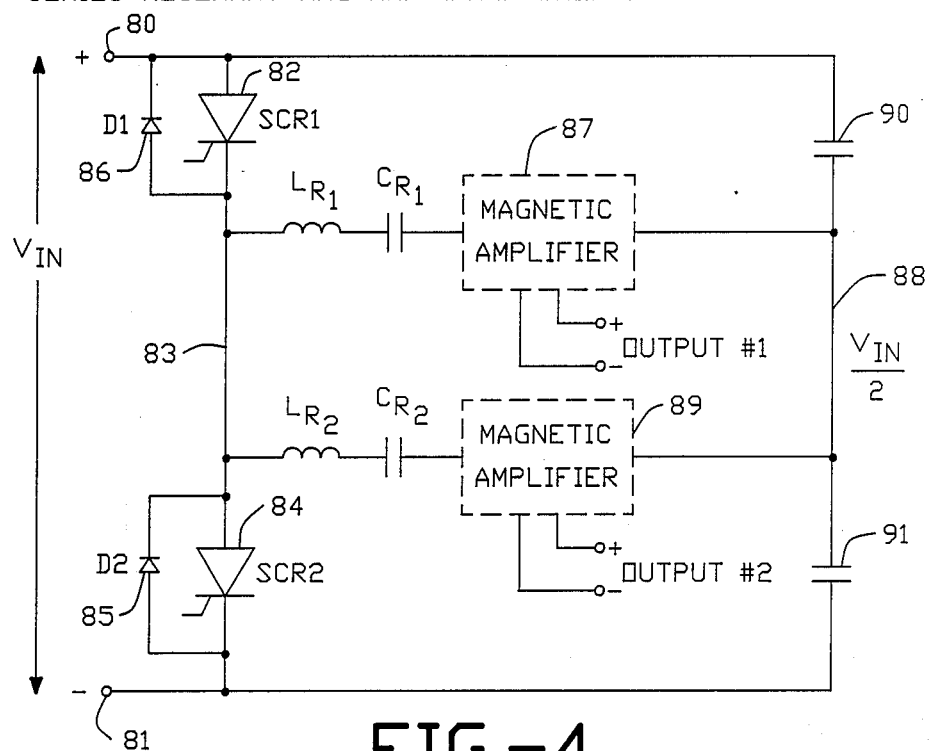
FIG. 4 is schematic diagram of the series resonant magnetic amplifier power supply with a plurality of outputs, according to the present invention.
Figure 5:
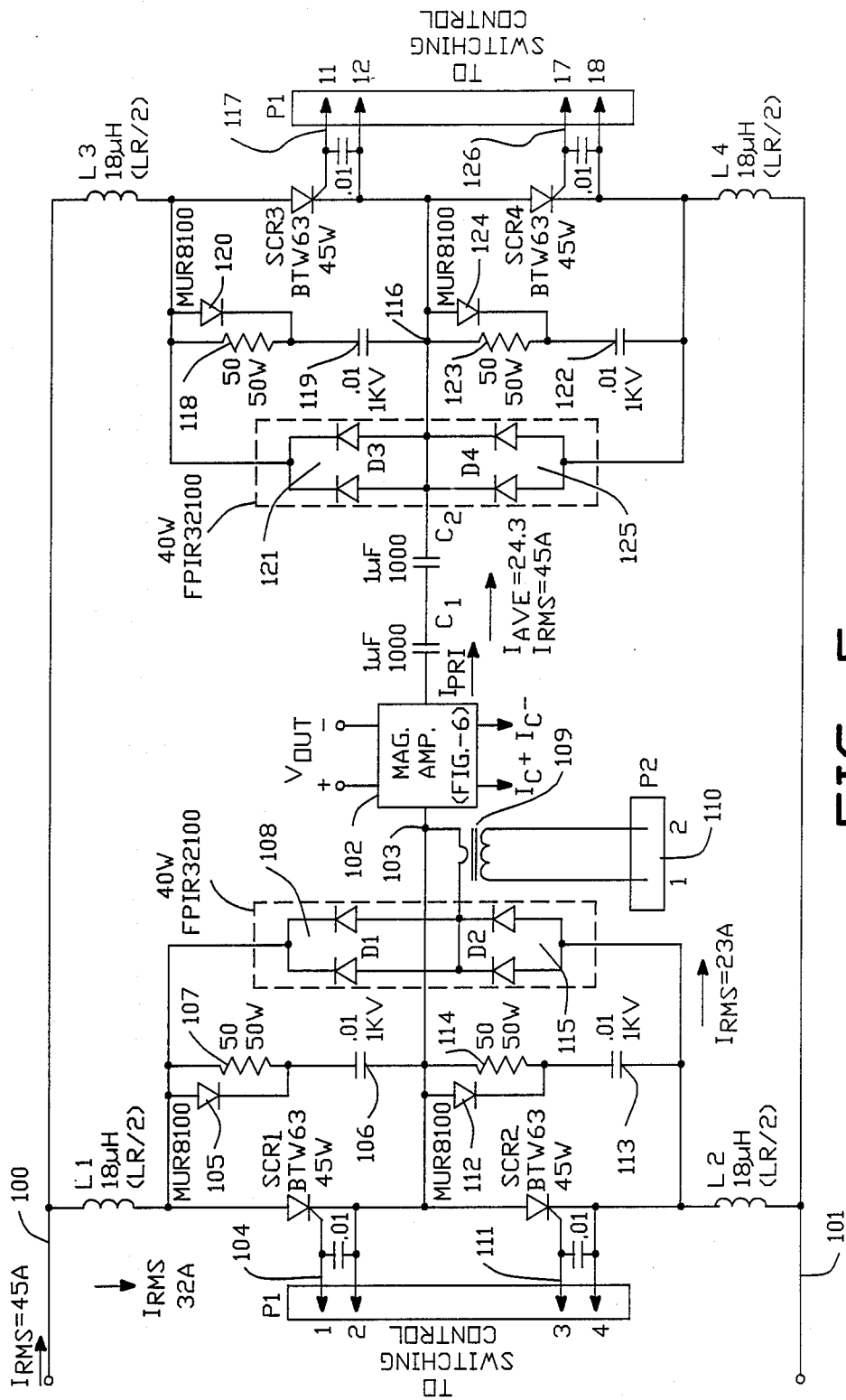
FIG. 5 is a circuit diagram of a full-bridge circuit for the series resonant magnetic amplifier power supply, according to the present invention.
Figure 6:
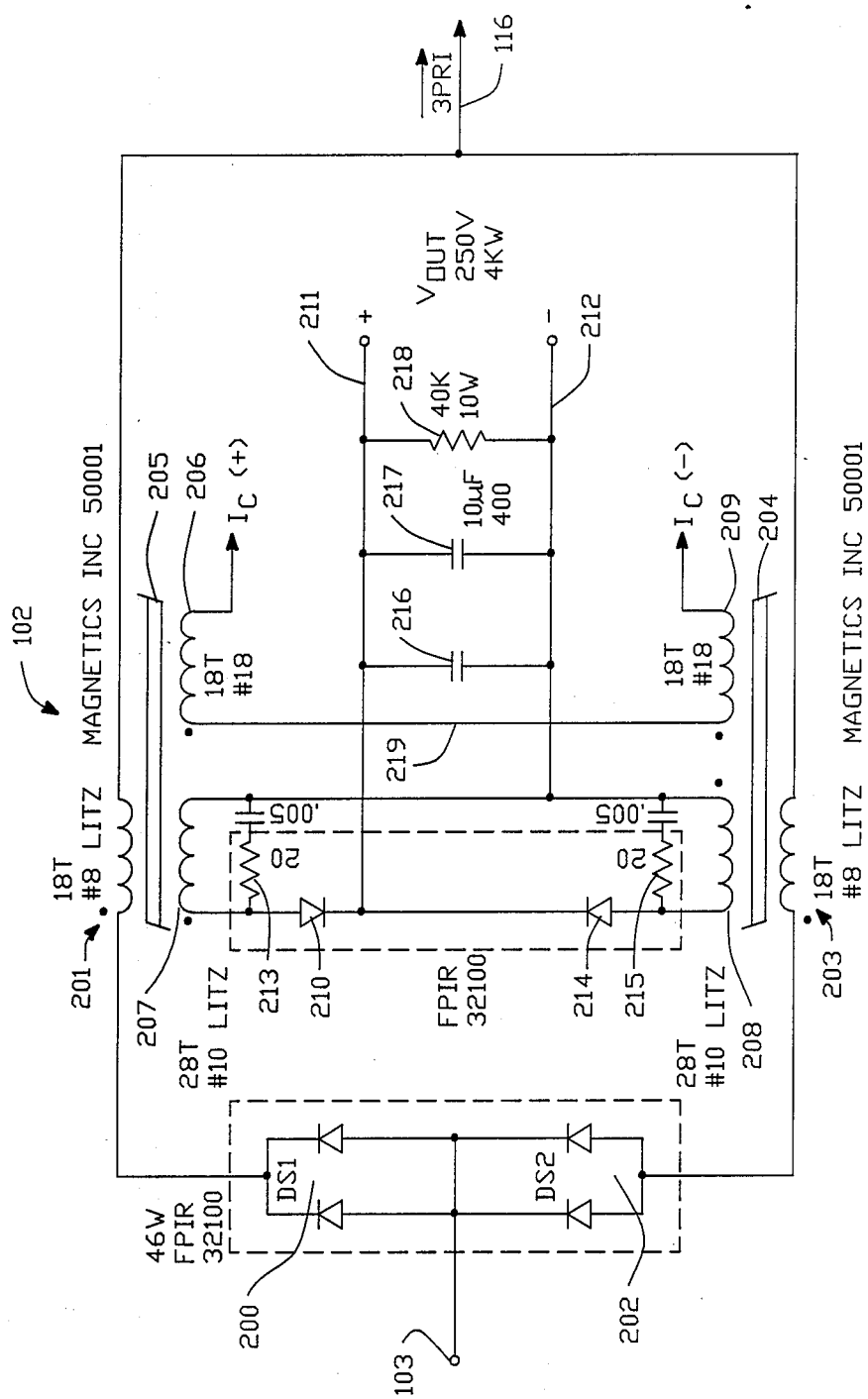
FIG. 6 is a circuit diagram of the magnetic amplifier used in the full-bridge circuit shown in FIG. 5.

FIG. 2 illustrates the basic half-bridge resonant magnetic amplifier power supply according to the present invention. FIGS. 3 and 4 illustrate alternative embodiments, wherein FIG. 3 shows the full-bridge implementation and FIG. 4 shows multiple output implementation in a single half-bridge circuit. FIGS. 5 and 6 illustrate a preferred embodiment of a full-bridge circuit according to the present invention.

As shown in FIG. 2, the half-bridge resonant magnetic amplifier power supply receives an unregulated input voltage $V_{IN}$ across a positive input terminal 20 and a negative input terminal 21.

The circuit converts the unregulated DC input $V_{IN}$ to a regulated output $V_{OUT}$ across positive output terminal 22 and negative output terminal 23.

The positive input terminal 20 and the negative terminal 21 may receive the unregulated DC input from a circuit consisting of a single phase or three phase AC power source in series with a rectifier as known in the art.

The circuit consists of a first switching element 24 coupled to conduct current from the positive input terminal 20 to a first common terminal 21. The switching element 24 consists of a silicon controlled rectifier SCR1 in a preferred embodiment. However, the switching element may be a power transistor such as a MOSFET, a bipolar power transistor, an IGBT or other power transistor as known in the art. Silicon controlled rectifiers are preferred because of lower cost at power levels above 5 KW. The switching element SCR1 includes a turn-on gate 25 which is pulsed at a prespecified frequency.

Connected from the first common terminal 21 to the positive input terminal 20 is a feedback diode D1.

Similarly, a second switching element 26 is coupled to conduct current from the first common terminal 27 to the negative input terminal 21 in response to signals supplied to the gating input terminal 28. A feedback diode D2 is coupled from terminal 21 to the first common terminal 27.

Magnetic amplifier 29 is coupled between common terminal 27 and a second common terminal 30. A capacitor 31 is coupled from second common terminal 30 to the positive input terminal 20, and capacitor 32 is coupled from the second common terminal 30 to the negative input terminal 21.

An inductor $L_R$ and capacitor $C_R$ are coupled in the series path for current conducting from positive input terminal 20 through the first switching element 24, and the magnetic amplifier 29 to the negative input terminal, and for current flowing from the positive input terminal 20 through the magnetic amplifier and the second switching element 26 to the negative input terminal. In the diagram shown in FIG. 2, $L_R$ and $C_R$ are shown between the common terminal 27 in the magnetic amplifier 29. However, as known in the art, the position of the capacitor $C_R$ and the inductor $L_R$ can be anywhere in the series circuit. Further, they can be split up, so long as the resonant frequency of the current path through the first switching element 24 is the same as the resonant frequency through the second switching element 26. For instance, the inductor $L_R$ could be replaced with two inductors, one coupled between the positive input terminal 20 and the switching element 24, and a second coupled between the negative input terminal 21 and the switching element 28. Similar modifications in the position of the capacitor $C_R$ could be made.

The magnetic amplifier 29 consists of a first saturable core 33 having a primary winding 34, a secondary winding 36, and a control winding 35. In addition, a second saturable core 37 having a primary winding 38, a secondary winding 39 and a control winding 40 is included.

Reference data for magnetic amplifiers can be found in a variety of sources, including REFERENCE DATA FOR RADIO ENGINEERS, Fifth Edition, published by International Telephone and Telegraph Corporation (1968, pp 14-1 through 14-5).

The primary 34 of the first saturable core 33 is coupled through steering diode 41 with its anode coupled with first common terminal 27 and its cathode connected to the positive input terminal of the primary 34. Thus, when the first switching element 24 is turned on, current flows through the first switching element 24, the primary 34, the capacitor 32 to the negative input terminal 21.

A control current is supplied to the control winding 35 to maintain the saturable core 34 near saturation. Current is generated in the secondary coil 36 in response to current in the primary coil 34 and the control current 35. In operation, the current is generated in the secondary coil 36 until the saturable core 33 reaches saturation. When the core is saturated, the current in the secondary coil goes to zero.

Similarly, the primary coil 38 of the second saturable core 37 is coupled to the anode of steering diode 42. The cathode of steering diode 42 is coupled with the common terminal 27, so that when the first switching element 24 is turned off and the second switching element 26 is turned on, current flows from the positive input terminal through the primary 38 of the second saturable core 37, and through the second switching element 26 to the negative input terminal 21. The control current is supplied to the control winding 40 of the second saturable coil 37 to maintain the saturable coil near saturation. The current is transferred from the primary 38 to the secondary coil 39 in response to current in the primary and the control current.

The secondary coil 36 of the first saturable core 33 and the secondary coil 39 of the second saturable core 37 are coupled to an output rectifying circuit. The output rectifying circuit consists of diode 44, diode 45 and capacitor 43. Capacitor 43 is coupled between the negative output terminal 23 and the positive output terminal 22. The anode of rectifying diode 44 is coupled to the negative terminal of the secondary 39 of the second saturable core 37. The cathode of rectifying diode 44 is coupled to the positive output terminal 22. Likewise, the anode of rectifying diode 45 is coupled to the positive terminal of the secondary 36 of the first saturable core 33, and the cathode of rectifying diode 45 is coupled to the positive output terminal 22. The negative output terminal 23 is coupled to the positive terminal of the secondary 39 and the negative terminal of the secondary 36.

The current in the primary and secondary coils in the magnetic amplifier 29 of FIG. 2 are shown in FIGS. 2A and 2B respectively. FIG. 2A shows $I_{PRI}$ flowing through the series resonant bridge at terminal 30 or terminal 27. When SCR1 is on, the current $I_{PRI}$ appears as a positive half cycle of a sinusoid as shown at 50. After SCR1 is turned off, a small feedback current flows through diode D1 as shown at 51. When SCR2 is turned on, current flows in the opposite direction as shown at 53. After SCR2 is turned off, a small feedback current flows through D2 as shown at 54. SCR1 is turned on again, and current flows in the positive direction as shown at 55. This cycle continues as long as the power supply is on at a constant frequency above the audio range to prevent hum. Of course, the system can be operated at any frequency that can be supported by the components used. The magnitude of the feedback current varies with variations in the load as known in the art.

Current through the secondary coils $I_{SEC}$ which is delivered to the rectifying output circuit is shown in FIG. 2B. FIG. 2B shows the combination of the current in secondary coil 36 of saturable core 33 and secondary coil 39 of saturable core 37. Thus, when current begins flowing through the primary of saturable coil 33, it is transformed into the secondary for a period of time $T_s$ until the saturable core 33 saturates. The period of time $T_s$ is controlled by varying the magnitude of the control current through the control coil 35 as known in the art. Likewise, when the SCR2 is turned on, current flow through the primary 38 of the second saturable core 37 and is transformed into the secondary coil 39 until the core saturates. Thus, the amount of current which enters the rectifying current output circuit in use for generating the output voltage $V_{OUT}$ is controlled by varying the magnitude of the control current though the control windings 35 and 40. The frequency of switching the SCRs does not need to be changed in order to change the magnitude of the output voltage $V_{OUT}$. Thus, the switching frequency of the switching elements 24 and 26 can be maintained above the audible range in order to avoid power supply hum.

FIG. 3 illustrates a full-bridge implementation of the present invention. In this implementation, the unregulated input voltage is applied across terminals 60 and 61. A first switching element 62 with a feedback diode 63 is coupled from input terminal 60 to a first common terminal 64. A second switching element 65 with the feedback diode 66 is coupled from the first common terminal 64 to the negative input terminal 61. A third switching element 67 is coupled from the positive input terminal 60 to the second common terminal 68. Feedback diode 69 accompanies the third switching element 67. A fourth switching element 70 is coupled from the second common terminal 68 to negative input terminal 61. Feedback diode 71 is coupled across the fourth switching element 70.

The magnetic amplifier 72 is controlled to generated $V_{OUT}$ across terminals 73 as discussed with reference to FIG. 2. Inductor $L_R$ and capacitor $C_R$ are placed in the circuit to provide series resonance for the full-bridge switching circuit.

The full-bridge implementation of FIG. 3 should be utilized for higher output powers when it is desired to obtain double the power than is available using the half-bridge implementation of FIG. 2.

FIG. 4 illustrates an alternative embodiment of the present invention with plural outputs. In the embodiment of FIG. 4, the unregulated input voltage is supplied across terminals 80 and 81. First switching element 82 is coupled from terminal 80 to first common terminal 82. The second switching element 84 is coupled from first common terminal 83 to the negative input terminal 81. A feedback diode 85 is coupled across the second switching element 84 and a feedback diode 86 is coupled across the first switching element 82. A first magnetic amplifier 87 is coupled from first common terminal 83 to a second common terminal 88. A second magnetic amplifier 89 is coupled, in parallel with the first magnetic amplifier, from the first common terminal 83 to the second common terminal 88. In the series with magnetic amplifier 87 is an inductor $L_{R1}$ and a capacitor $C_{R1}$ creating a series resonant circuit. Likewise, in a series with magnetic amplifier 89 is an inductor $L_{R2}$ and a capacitor $C_{R2}$ creating a series resonant circuit. Capacitor 90 is coupled from the second common terminal 88 to the positive input terminal 80 and capacitor 91 is coupled from the common 88 to the negative input terminal 81.

In the implementation shown in FIG. 4, $L_{R1}C_{R1} = L_{R2}C_{R2}$. This multiple output circuit is desirable in systems requiring more than one regulated voltage output, such as a high power ion laser with a first voltage output required for the gas discharge path through the plasma, and a second voltage output required for axial magnetic field used for enhancing the plasma.

The multiple output circuit shown in FIG. 4 is also adaptable to full-bridge circuits.

FIGS. 5 and 6 illustrates a preferred implementation of the series resonant magnetic amplifier power supply, switched at 20 KHz with input voltage at 250 to 300 volts DC, according to the present invention. Values are given for the inductors, capacitors and resistors, and part numbers are given for the diodes and SCRs used in the circuit.

The circuit consists of a positive input terminal 100 and a negative input terminal 101. The system implements a full-bridge rectifying circuit with the magnetic amplifier 102 providing regulation of the output voltage $V_{OUT}$. The implementation of the magnetic amplifier 102 is shown in detail in FIG. 6. The bridge shown in FIG. 5 consists of an inductor L1 coupled from terminal 100 to the anode of SCR1. The cathode of SCR1 is coupled to first common terminal 103. The anode of SCR1 is coupled to the anode of diode 105. The cathode of diode 105 is coupled through capacitor 106 to common terminal 103. Resistor 107 is coupled across diode 105. The diode 105, capacitor 106 and resistor 107 provide a snubber circuit. Feedback diode D1 consists of the diode pair 108 which is coupled through the sensor transformer 109 to the common terminal 103. The sensor transformer 109 generates a current through terminals 110 which indicates the magnitude of the feedback current flowing through the diodes D1 or D2. This current is monitored to ensure that some feedback current always flows to assist in "turning off" the SCRs in the circuit.

Similarly, inductor L2 is coupled from the negative input terminal 101 to the cathode of SCR2. The anode of SCR2 is coupled to the common terminal 103. The switch control signals are supplied on line 111 to control SCR2. Diode 112, capacitor 113, and resistor 114 are connected to provide a snubber path across SCR2. Diode D2 consists of the diode pair 115 which is coupled through the sense transformer to the common terminal 103.

First common terminal 103 is coupled through a magnetic amplifier 102, and capacitors C1 and C2 in series with second common terminal 116.

Inductor L3 is coupled from the positive input terminal 100 to the anode of SCR3. The cathode of SCR3 is coupled to second common terminal 116. Control signals for SCR3 are coupled through lines 117 to a switching control circuit.

Resistor 118, capacitor 119, and diode 120 provide a snubber path across SCR3. The diode D3 consists of the diode pair 121 which is coupled from the second common terminal 116 to the anode of the SCR3.

Inductor L4 is coupled from the negative input terminal 101 to the cathode of SCR4. The anode of SCR4 is coupled to the second common terminal 116. Capacitor 122, resistor 123 and diode 124 provide a snubber path around SCR4. The diode D4 consists of the diode pair 125 which is coupled from the cathode of SCR4 to the second common terminal 116. SCR4 is controlled across lines 126.

The switching control circuit (not shown) switches SCR1, SCR2, SCR3 and SCR4 at a constant prespecified switching frequency above the audio range. SCR1 and SCR4 are switched in phase, SCR3 and SCR2 are likewise switched in phase, however, SCR3 and SCR2 are switched 180° out of phase with SCR1 and SCR4.

FIG. 6 illustrates implementation of the magnetic amplifier 102 which is coupled between first common terminal 103 and second common terminal 116. A steering diode DS1 consisting of diode pair 200 is coupled from first common terminal 103 to the input of primary winding 201 of a first saturable core transformer. Output of the primary 201 is coupled to second common terminal 116.

Steering diode DS2 consisting of diode pair 202 is coupled from the output of primary coil 203 of the second saturable core transformer to the first common terminal 103. The input to primary coil 203 of the second saturable core is coupled to second common terminal 116.

The first saturable core 205 has a control winding 206 and a secondary winding 207. The primary winding 201 is an 18 turn, gauge 8 Litz wire winding. The secondary winding is a 28 turn, gauge 10 Litz wire winding. The control winding is an 18 turn, gauge 18 wire winding. The core is a Magnetics, Inc. 50001 square hysteresis saturable core.

Likewise, the second saturable core 204 includes a secondary winding 208 and a control winding 209. The primary winding 203 of the first saturable core 204 is an 18 turn, gauge 8 Litz wire winding. The saturable core itself is a Magnetics, Inc. 50001. The secondary winding of the second saturable core is a 28 turn, gauge 10 Litz wire winding. The control winding on the second saturable core 204 is an 18 turn, gauge 18 wire winding.

The positive terminal of the secondary 207 of the first saturable core 205 is coupled to the anode of rectifying diode 210. The cathode of rectifying diode 210 is coupled to the positive output terminal 211. The negative terminal of secondary winding 207 is coupled to the negative output terminal 212. A shunt resistor/capacitor combination 213 is coupled across and positive and negative terminals of the secondary winding 207. Similarly, the secondary winding 208 of the second saturable core 204 is coupled through rectifying diode 214 to the positive output terminal 211. The positive terminal of winding 208 of the second saturable core 204 is coupled to the negative output terminal 212. A shunt resistor/capacitor combination 215 is coupled across the positive and negative terminals of the secondary winding 208.

The rectifying output circuit includes a capacitor 216 and capacitor 217, in parallel, across the positive terminal 211 and the negative terminal 212. Resistor 218 is also coupled across terminals 211 and 212.

The positive terminal of control winding 206 of the first saturable core 205 and the positive terminal of control winding 209 if the first saturable core 204 are coupled across line 219. The control current is supplied from the negative terminal of the control winding 206 out the negative terminal of the control winding 209. The magnitude of the control current can be varied using a standard variable power supply ranging, for example, from + to −1/10th of an amp.

CONCLUSION

Accordingly, the present invention provides a series resonant power supply which operates at frequencies above the audio range, which is essentially greater than 18 kilohertz, so that no annoying hum is generated. The components are relatively low cost and it provides high efficiency at high power operation.

The "frequency" of the power supply refers to the frequency at which the switching elements are turned on and off.

The output power of the power supply according to the present invention is controlled by controlling current in control coils of saturable core transformers. By varying the value of the current in the control coils, the time required to reach the saturation point in the core can be varied. The more time that the current is transformed from the primary to the secondary, the greater the amount of current generated in the secondary and the greater the output voltage.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A series resonant power supply for supplying a regulated DC output in response to an unregulated DC input across a positive input terminal and a negative input terminal, comprising:

magnetic amplifying means, having a first primary terminal, a second primary terminal, a control input, and an output terminal, for generating a DC output voltage at the output terminal regulated in response to a control signal supplied to the control input and to current through the first primary terminal and the second primary terminal;

first switching means, having a first terminal coupled to the positive input terminal and a second terminal coupled to the first primary terminal, for switching current flow from the positive input terminal to the first primary terminal;

second switching means, having a first terminal coupled to the negative input terminal and a second terminal coupled to the first primary terminal, for switching current flow from the first primary terminal to the negative input terminal out of phase with respect to the first switching means;

means for providing a current path between the positive input terminal and the second primary terminal; and means for providing a current path between the second primary terminal and the negative input terminal.

2. The power supply of claim 1, wherein the magnetic amplifying means includes:

first transformer means, having a first primary coil connected to supply current from the first primary terminal to the second primary terminal, a first control coil connected to receive the control signal, and a first secondary coil, for generating current in the first secondary coil in response to the current in the first primary coil and the control signal;

second transformer means, having a second primary coil connected to supply current from the second primary terminal to the first primary terminal, a second control coil connected to receive the control signal, and a second secondary coil, for generating current in the second secondary coil in response to the current in the second primary coil and the control signal; and output means, connected across the first secondary coil and the second secondary coil for converting the current in the first secondary coil and second secondary coil to a DC output.

3. The power supply of claim 1, wherein:

the means for providing a current path between the positive input terminal and the second primary terminal includes:

third switching means, having a first terminal coupled to the positive input terminal and a second terminal coupled to the second primary terminal, for switching current flow from the positive input terminal to the second primary terminal in phase with the second switching means; and the means for providing a current path between the second primary terminal and the negative input terminal includes:

fourth switching means, having a first terminal coupled to the negative input terminal and a second terminal coupled to the second primary terminal, for switching current flow from the second primary terminal to the negative input terminal in phase with the first switching means.

4. The power supply of claim 1, wherein the first switching means and second switching means are switched at a constant switching frequency.

5. The power supply of claim 1, wherein the first switching means and second switching means are switched at a constant switching frequency above the audio range.

6. A series resonant power supply for supplying a plurality of regulated DC outputs in response to an unregulated DC input across a positive input terminal and a negative input terminal, comprising:

a plurality of magnetic amplifying means, each having a first primary terminal, a second primary terminal, a control input, and an output terminal, for generating a plurality of DC output voltages at the respective output terminals regulated in response to respective control signals supplied to the respective control inputs and to current through the respective first primary terminals and second primary terminals;

first switching means, having a first terminal coupled to the positive input terminal and a second terminal coupled to the first primary terminals of the plurality of magnetic amplifying means, for switching current flow from the positive input terminal to the first primary terminals;

second switching means, having a first terminal coupled to the negative input terminal and a second terminal coupled to the first primary terminals of the plurality of magnetic amplifying means, for switching current flow from the first primary terminals to the negative input terminal out of phase with respect to the first switching means;

means for providing a current path between the positive input terminal and the second primary terminals of the plurality of magnetic amplifying means; and means for providing a current path between the second primary terminal and the negative input terminals of the plurality of magnetic amplifying means.

7. The power supply of claim 6, wherein each of the plurality of the magnetic amplifying means includes:

first transformer means, having a first primary coil connected to supply current from the first primary terminal to the second primary terminal, a first control coil connected to receive the control signal, and a first secondary coil, for generating current in the first secondary coil in response to the current in the first primary coil and the control signal;

second transformer means, having a second primary coil connected to supply current from the second primary terminal to the first primary terminal, a second control coil connected to receive the control signal, and a second secondary coil, for generating current in the second secondary coil in response to the current in the second primary coil and the control signal; and output means, connected across the first secondary coil and the second secondary coil for converting the current in the first secondary coil and second secondary coil to the DC output.

8. The power supply of claim 6, wherein:

the means for providing a current path between the positive input terminal and the second primary terminals includes:

third switching means, having a first terminal coupled to the positive input terminal and a second terminal coupled to the second primary terminals, for switching current flow from the positive input terminal to the second primary terminals in phase with the second switching means; and the means for providing a current path between the second primary terminals and the negative input terminal includes:

fourth switching means, having a first terminal coupled to the negative input terminal and a second terminal coupled to the second primary terminals, for switching current flow from the second primary terminals to the negative input terminal in phase with the first switching means.

9. The power supply of claim 6, wherein the first switching means and second switching means are switched at a constant switching frequency.

10. The power supply of claim 6, wherein the first switching means and second switching means are switched at a constant switching frequency above the audio range.

11. A series resonant power supply for supplying a regulated DC output in response to an unregulated DC input across a positive input terminal and a negative input terminal, comprising:
  first transformer means, having a first primary coil connected to supply current from a first primary terminal to a second primary terminal, a first control coil connected to receive a first control signal, and a first secondary coil, for generating current in the first secondary coil in response to the current in the first primary coil and the first control signal;
  second transformer means, having a second primary coil connected to supply current from the second primary terminal to the first primary terminal, a second control coil connected to receive a second control signal, and a second secondary coil, for generating current in the second secondary coil in response to the current in the second primary coil and the second control signal; and
  output means, connected across the first secondary coil and the second secondary coil for converting the current in the first secondary coil and second secondary coil to a DC output;
  first switching means, having a first terminal coupled to the positive input terminal and a second terminal coupled to the first primary terminal, for switching current flow from the positive input terminal to the first primary terminal;
  second switching means, having a first terminal coupled to the negative input terminal and a second terminal coupled to the first primary terminal, for switching current flow from the first primary terminal to the negative input terminal out of phase with respect to the first switching means;
  means for providing a current path between the positive input terminal and the second primary terminal; and
  means for providing a current path between the second primary terminal and the negative input terminal,
  wherein the first switching means and second switching means are switched at a constant switching frequency above the audio range.

12. The power supply of claim 11, wherein:
  the means for providing a current path between the positive input terminal and the second primary terminals includes:
  third switching means, having a first terminal coupled to the positive input terminal and a second terminal coupled to the second primary terminals, for switching current flow from the positive input terminal to the second primary terminals in phase with the second switching means; and
  the means for providing a current path between the second primary terminals and the negative input terminal includes:
  fourth switching means, having a first terminal coupled to the negative input terminal and a second terminal coupled to the second primary terminals, for switching current flow from the second primary terminals to the negative input terminal in phase with the first switching means.

* * * * *